(12) United States Patent
Zhang et al.

(10) Patent No.: US 8,437,969 B2
(45) Date of Patent: May 7, 2013

(54) ACCURATE MAGNETIC FIELD SENSOR AND METHOD FOR WIRELESS PHASOR MEASUREMENT UNIT

(75) Inventors: Guorui Zhang, San Jose, CA (US); Yilu Liu, Knoxville, TN (US); Yingchen Zhang, Blacksburg, VA (US)

(73) Assignee: Virginia Polytechnic Institute and State University, Blacksburg, VA (US)

( * ) Notice: Subject to any disclaimer, the term of this patent is extended or adjusted under 35 U.S.C. 154(b) by 463 days.

(21) Appl. No.: 12/723,763

(22) Filed: Mar. 15, 2010

(65) Prior Publication Data

US 2010/0250168 A1 Sep. 30, 2010

Related U.S. Application Data

(60) Provisional application No. 61/165,003, filed on Mar. 31, 2009.

(51) Int. Cl.
*G01R 29/26* (2006.01)
*G06F 11/30* (2006.01)

(52) U.S. Cl.
USPC ............ 702/70; 702/182; 702/183; 702/189

(58) Field of Classification Search ............ 702/70–76, 702/182–190
See application file for complete search history.

(56) References Cited

U.S. PATENT DOCUMENTS

| | | | |
|---|---|---|---|
| 4,814,695 A | 3/1989 | Troesch | |
| 4,894,608 A | 1/1990 | Ulmer | |
| 5,391,929 A | 2/1995 | Kalyon et al. | |
| 5,608,328 A | 3/1997 | Sanderson | |
| 5,793,750 A | 8/1998 | Schweitzer, III et al. | |
| 6,662,124 B2 | 12/2003 | Schweitzer, III et al. | |
| 6,771,058 B2 * | 8/2004 | Lapinksi et al. | ......... 324/117 R |

(Continued)

FOREIGN PATENT DOCUMENTS

| | | |
|---|---|---|
| WO | WO 99/08117 A2 | 2/1999 |
| WO | WO 2006/021030 | 3/2006 |
| WO | WO 2007/070255 A2 | 6/2007 |

OTHER PUBLICATIONS

G. Zhang, Wide Area Frequentcy Visusalization Using Smart Client Technology, Power Engineering Society General Meeting, Jun. 24-28, 2007, pp. 1-8, Tampa, FL.

(Continued)

*Primary Examiner* — Phuong Huynh
(74) *Attorney, Agent, or Firm* — Curatolo Sidoti Co., LPA; Joseph G. Curatolo; Salvatore A. Sidoti

(57) ABSTRACT

A phasor measurement unit and method including a transducer for transduction measurement of an electrical characteristic of a current carrying element in electrical power generation or distribution systems, the transducer generating a transducer output signal representative of the electrical characteristic; an amplifier receiving the transducer output signal and generating an amplifier output signal; a filter receiving the amplifier output signal, low pass filtering the amplifier output signal, and generating a filter output signal; an analog to digital converter receiving the filter output signal and generating a digital output signal; and a processor receiving the digital output signal, calculating phasor data from the digital output signal and generating a data output signal, wherein the calculated phasor data is at least as accurate as phasor data from a phasor measurement unit or a frequency data recorder having a transducer for nontransduction measurement of the same electrical characteristic.

18 Claims, 2 Drawing Sheets

U.S. PATENT DOCUMENTS

| | | |
|---|---|---|
| 6,947,269 B2 | 9/2005 | Lee et al. |
| 7,088,090 B2 | 8/2006 | Staats |
| 7,141,987 B2 | 11/2006 | Hibbs et al. |
| 7,164,263 B2 | 1/2007 | Yakymyshyn et al. |
| 7,233,843 B2 | 6/2007 | Budhraja et al. |
| 7,391,210 B2 | 6/2008 | Zhang et al. |
| 2002/0033706 A1 | 3/2002 | Khazei et al. |
| 2006/0066304 A1 | 3/2006 | Schill et al. |
| 2006/0224336 A1 | 10/2006 | Petras et al. |
| 2007/0024293 A1 | 2/2007 | Kosaka et al. |
| 2007/0150114 A1 | 6/2007 | Gardner et al. |
| 2008/0048640 A1 | 2/2008 | Hull et al. |
| 2008/0079437 A1 | 4/2008 | Robarge et al. |
| 2008/0082276 A1 | 4/2008 | Rivers et al. |
| 2009/0307233 A1 | 12/2009 | Zhang et al. |

OTHER PUBLICATIONS

A.P. Sakis Meliopoulos, et al., PMU Data Characterization and Application to Stability Monitoring, IEEE, 2006, p. 151.

J.E. Dagle, North American SychroPhasor Initiative, Proceedings of the 41$^{st}$ Hawaii International Conference on System Sciences, 2008, Kauai, Hawaii.

John P. Stovall, et al., Issues Associated with the Development of a Wide-Area Analysis and Visualization Environment, Proceedings of the Hawaii international Conference on System Sciences, p. 1, Jan. 4-8, 2006, Kauai, Hawaii.

George J. Cokkinides, et al., Visualization and Characterization of Stability Swings Via GPS-Synchronized Data, Proceedings of the 40$^{th}$ Hawaii International Conference on System Sciences, 2007, p. 1, Kauai, Hawaii.

Joseph Euzebe Tate, et al., Line Outage Detection Using Phasor Angle Measurements, IEEE Transactions on Power Systems, Nov. 2007.

Steve Widergren, Visualization & Controls Program Peer Review, Consortium for Electric Reliability Technology Solutions, Presented on Oct. 17, 2006, Arlington, VA.

Charles Matthew Davis, et al., Wide Area Phasor Data Visualization, Presented at the 39$^{th}$ North American Power Symposium, Sep. 30-Oct. 2, 2007.

Andy Brown, et al., Sychronized Power System Measurement Visualization Tool, Presented on Feb. 22, 2007.

Floyd Galvan, Blackout: Shocked Into Action, Transmission & Distribution World, Nov. 1, 2006.

Biju Naduvathuparambil, et al., "Communication Delays in Wide Area Measurement Systems (WAMS)", 2002, 0-7803-7339-1/02, IEEE.

Vijay Vittal, et al., "A Tool for On-line Stability Determination and Control for Coordinated Operations between Regional Entities Using PMU's", Final Project Report, Jan. 2008, title pp. iv, Publication Aug. 2001, Power System Engineering Research Center, Arizona State University.

* cited by examiner

ACCURATE MAGNETIC FIELD SENSOR AND METHOD FOR WIRELESS PHASOR MEASUREMENT UNIT

This application claims the benefit pursuant to 35 U.S.C. 119(e), of U.S. Provisional Application for Patent Ser. No. 61/165,003, filed Mar. 31, 2009, incorporated herein by reference.

Provided is a device and method for real-time monitoring in the field of electrical power systems. More particularly, provided is a real-time Phasor Measurement Unit (PMU) and method for measurement in the field of monitoring and situational awareness of large interconnected electrical power systems.

The operators and regional or sub-regional security coordinators of a large interconnected power system need to know what is happening at their neighboring systems in order to improve their situation awareness. When a large event occurs in an interconnected power system, such as a large generator outage, large substation outage or a large transmission line or HVDC link outage, it is very beneficial for the operators or security coordinators to know the estimated location, the magnitude, and the type of the event in real-time, such that the operators and security coordinators of the power systems affected by the event will be able to work together to take appropriate and coordinated control actions to handle the event.

Power system operators, managers and engineers use visualization systems to perform real-time monitoring, state estimation, stability control and post-event analysis of interconnected power systems. These visualization systems assist power systems users in understanding and analyzing frequency characteristics and disturbance events of local and neighboring power systems. Disturbance events include generator outages, load outages. and transmission outages.

GPS-synchronized (also called GPS-based) Phasor Measurement Units (PMUs) have gained in popularity as the real-time measurement devices from which these visualization systems obtain the necessary real-time data. including GPS synchronized frequency, voltage magnitude. and phase angle for each phasor. Frequency Data Recorders (FDRs) receive and record PMU collected data. This popularity is at least in part due to the high measurement accuracy of GPS-synchronized PMUs and FDRs, essential to success of the visualization systems.

PMUs employ current transformers physically connected to the transmission line, transformers or bus to obtain current information necessary for phasor measurement. PMUs employ potential transformers physically connected to the transmission line, transformers or bus to obtain voltage information necessary for phasor measurement. The physically interconnected nature of current transformers and potential transformers allow PMUs to achieve the necessary high measurement accuracy with minimal or no degrading factors such as interference. However, the same physical interconnections that allow PMUs high measurement accuracy also result in PMUs that are more costly and difficult to install and maintain, particularly at the high voltages and currents of wide-area electrical transmission and distribution networks. The cost and difficulty in installing and maintaining PMUs has significantly limited the installation of PMUs, which, in turn. has slowed the growth and availability of visualization systems to better monitor, protect and control large interconnected electrical power systems.

DETAILED DESCRIPTION

In certain embodiments, a phasor measurement unit (PMU) includes a transducer for transduction measurement of an electrical characteristic of a current carrying element in at least one of electrical power generation or distribution systems. The transducer generates a transducer output signal representative of the electrical characteristic. The PMU may further include an amplifier receiving the transducer output signal and generating an amplifier output signal, a filter receiving the amplifier output signal, low pass filtering the amplifier output signal, and generating a filter output signal. a digital to analog converter receiving the filter output signal and generating a digital output signal, and a processor receiving the digital output signal, calculating phasor data from the digital output signal and generating a data output signal. The calculated phasor data is at least as accurate as phasor data from a phasor measurement unit or a frequency data recorder having a transducer for nontransduction measurement of the same electrical characteristic.

In certain embodiments, a method for phasor measurement includes transducing an electrical characteristic of a current carrying element in at least one of electrical power generation or distribution systems, generating a transducer output signal representative of the electrical characteristic, amplifying the transducer output signal. generating an amplifier output signal, low pass filtering the amplifier output signal, generating a filter output signal, converting the filter output signal to a digital output signal, calculating phasor data from the digital output signal, and generating a data output signal. The calculated phasor data is at least as accurate as phasor data from a phasor measurement unit or a frequency data recorder having a transducer for nontransduction measurement of the same electrical characteristic.

An accurate magnetic field sensor and method for a Wireless Phasor Measurement Unit (Wireless PMU) is provided. Embodiments of the Wireless PMU and method therefore are described in greater detail with reference to FIGS. 1-3. It should be noted that the figures merely show illustrative embodiments of the Wireless PMU and method therefore, and the scope of the Wireless PMU and method therefore is not intended to be limited by the illustrative embodiments shown in the figures.

Figure 1:
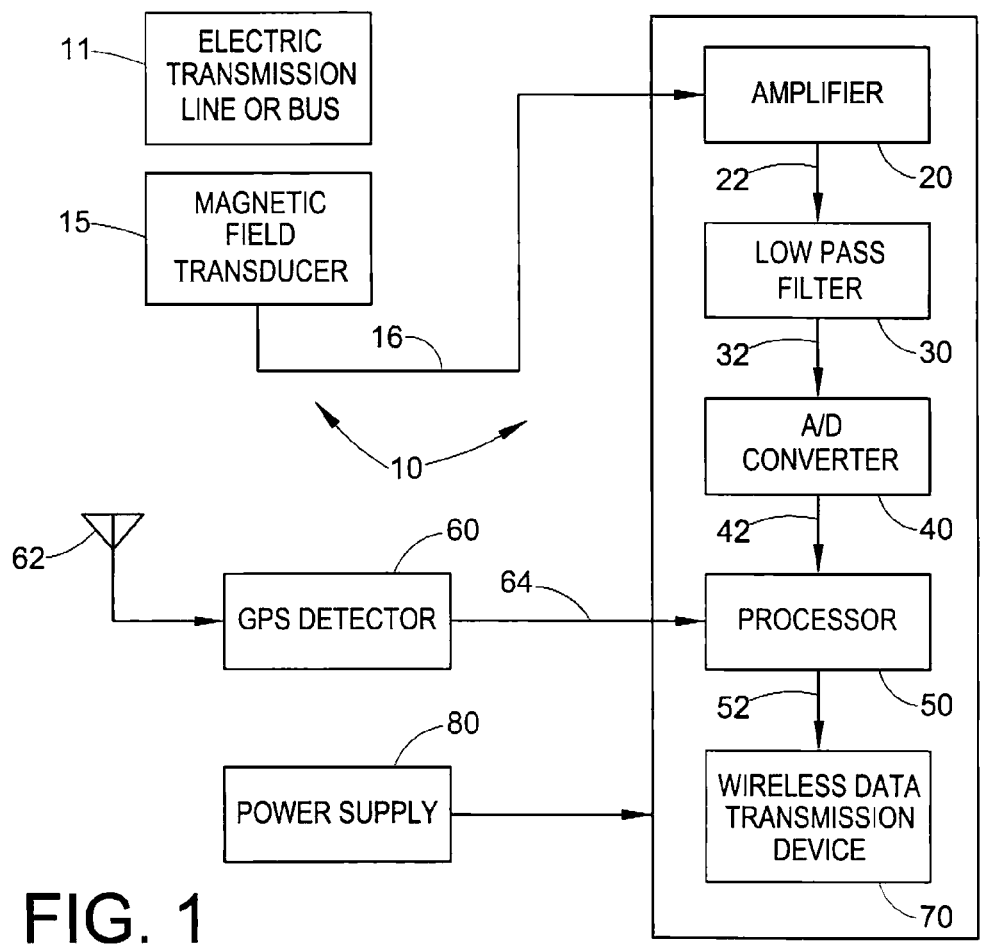
FIG. 1 is a top-level block diagram of an embodiment of a Wireless Phasor Measurement Unit.

An embodiment of the Wireless PMU, indicated generally in FIG. 1 by the numeral 10, provides phasor measurements of electrical characteristics of at least one electric transmission line, transformer or bus 11 (collectively, transmission line 11) using at least one transducer 15 not physically interconnected to transmission line 11.

Transducer 15 measures by transduction an electrical characteristic of a current carrying element such as transmission line 11 in electrical power generation and/or electrical power distribution systems, and generates at least one output signal 16 representative of that characteristic. Output signal 16 is received by an amplifier 20. Amplifier 20 generates an output signal 22 that is received by a low pass filter 30. Low pass filter 30 generates an output signal 32 that is received by an analog to digital (A/D) converter 40. A/D converter 40 generates a digital output signal 42 that is received by a processor 50.

A global positioning system (GPS) detector 60 has a receiving device such as an antenna 62. and provides a GPS synchronization signal 64 to processor 50. Processor 50 calculates phasor data such as current phase angle. frequency and/or net current phasor, and provides the data via a generated data output signal 52 to a data transmission device. In certain embodiments, wireless data transmission device 70 may transmit phasor data over any wireless network or system. Alternatively, the data transmission device may transmit phasor data over a wired. such as an Ethernet, network or system (not shown). A power supply 80 furnishes required power to Wireless PMU 10 components, as shown in FIG. 1. The calculated phasor data is at least as accurate as phasor data from a PMU or FDR having a transducer for nontransduction measurement of the same electrical characteristic. Further characteristics of Wireless PMU 10 components and signals are discussed below.

A broader understanding of the components and signals of a PMU that is to be wireless (that is, not physically connected to the line whose electrical characteristics are being measured), economical to install and maintain, and have the necessary high measurement accuracy, may be obtained from a discussion of various underlying factors.

The electrical characteristics of transmission line 11 monitored and calculated by Wireless PMU 10 may be found without physical connection to transmission 11 through measurement from the magnetic and electric fields generated by electric currents carried in transmission line 11, known as transduction. In accordance with Ampere's Law, an AC current flow through a power line will generate a time varying magnetic field which has the exact same frequency as its associated current. By approximation, this is also true for other current carrying elements, such as a station bus. And in the case of poly-phase networks where separate conductors are utilized for each phase current, the resultant total time varying magnetic field will be a superposition having the same frequency as each single phase current. In accordance with Faraday's Law, a magnetic flux passing through a turn of a coil induces a voltage in the coil turn that is directly proportional to the rate of change of the magnetic flux with respect to time. A coil with multiple turns has an induced total voltage equal to the sum of the voltage induced on each individual coil turn. For these reasons. when a coil of wire is placed in the magnetic field of a transmission line 11, the coil's induced voltage may be measured and used to determine such electrical characteristics as the phasor value of the current.

We have found that the greater the magnitude of the coil's induced voltage, the greater the accuracy of Wireless PMU 10. Consequently, it is desirable to design and construct a coil to be used as magnetic field transducer 15 to provide the maximum possible output signal 16. On the other hand. for reasons of economy and portability it is desirable to make the coil as small as possible.

Figure 2:
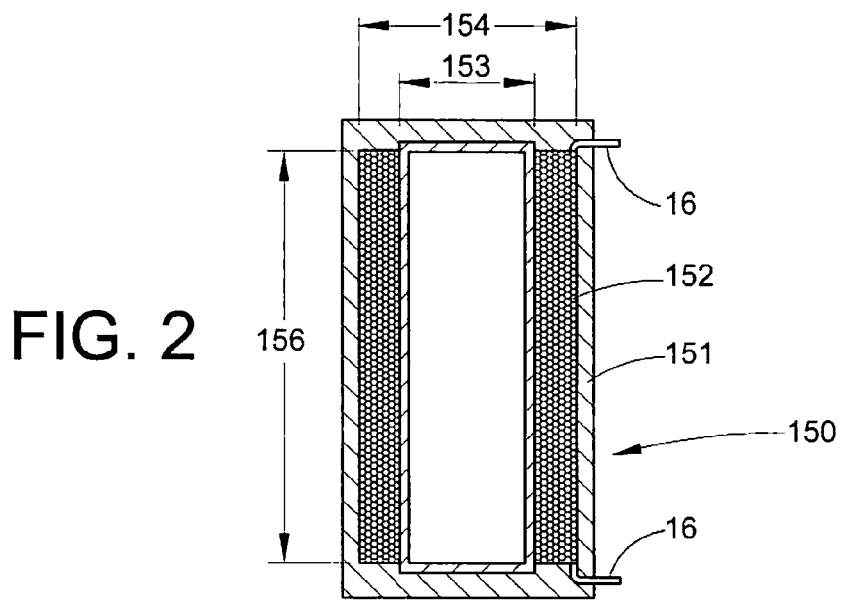
FIG. 2 is a sectional elevation of an exemplary magnetic field transducer.

As seen in FIG. 2 where a vertical sectional elevation of an exemplary electrical coil 150 having a magnetically transparent housing 151 is shown, electrical coils may be specified by their number of turns 152, a coil inner diameter 153, a coil outer diameter 154, and a coil length 156. The voltage induced upon a coil by a magnetic field is directly proportional to the magnetic flux permeability within the coil's core. that is. the center of the coil. Thus, it is possible to achieve greater coil output voltages with smaller physical dimensioned coils when iron is placed in the center of the coil. We have found that for exemplary coil dimensions an iron-cored coil produces an induced voltage fifteen times greater than a like dimensioned air-cored coil. However, we have also found that when a coil is placed within the magnetic field of a transmission line 11, even order harmonics are produced that exhibit nonlinearities within any iron core in the coil. These nonlinearities generate harmonics that significantly reduce measurement accuracy and are not feasible to remove by filtering. Consequently, in certain embodiments. the magnetic field transducer coil in Wireless PMU 10 may not include a magnetically permeable material to increase the magnitude of the voltage induced upon the coil where that material exhibits nonlinearities.

We further have found that one exemplary coil configuration suitable for use as magnetic field transducer 15 in Wireless PMU 10 is a coil 150 with 400 turns 152, an air core, a coil length 156 of 1.5 cm, a coil inner diameter 153 of 5 mm, and a coil external diameter 154 of 1 cm. When placed in a magnetic field having a flux density of 1 microTelsa ($\mu T$), the induced voltage on this exemplary coil would be about 0.0045 V. This flux density is useful for approximating the output signal voltage 16 because currents of from about 1000 A to 2000 A at transmission line voltage levels of from 138 kV to 500 kV produce a magnetic field strength at the industry standard measurement point (edge of the right-of-way (ROW) at a height of 3.28 ft (1 m)) of from about 1 $\mu T$ to 2 $\mu T$. Coil configurations of 600 and 800 turns have also been tested.

Wireless PMU 10 components may be selected and configured to be economical and maximize overall measurement accuracy. A digital processor or microcontroller controls Wireless PMU 10 and performs the necessary calculations to determine all desired phasor measurements. The analog output signal 16 from transducer 1 is converted to a digital signal. A/D converter 40 performs this function. However, the resolution of the digital signal output 42 from A/D converter 40. and the overall measurement accuracy, is significantly improved as the magnitude of the input signal to A/D converter reaches the maximum magnitude that A/D converter 40 can process. In other words. the closer the voltage magnitude of the input signal is to the input limit of A/D converter 40, the more accurate will be the resulting digitized signal. Thus, amplification of analog output signal 16 is desirable to increase measurement accuracy of Wireless PMU 10. Moreover, because the current carried on transmission line 11 can vary over several orders of magnitudes, the magnitude of analog output signal 16 also varies significantly. For this reason. it is also desirable to provide for a like variation in the gain of the amplifier.

Figure 3:
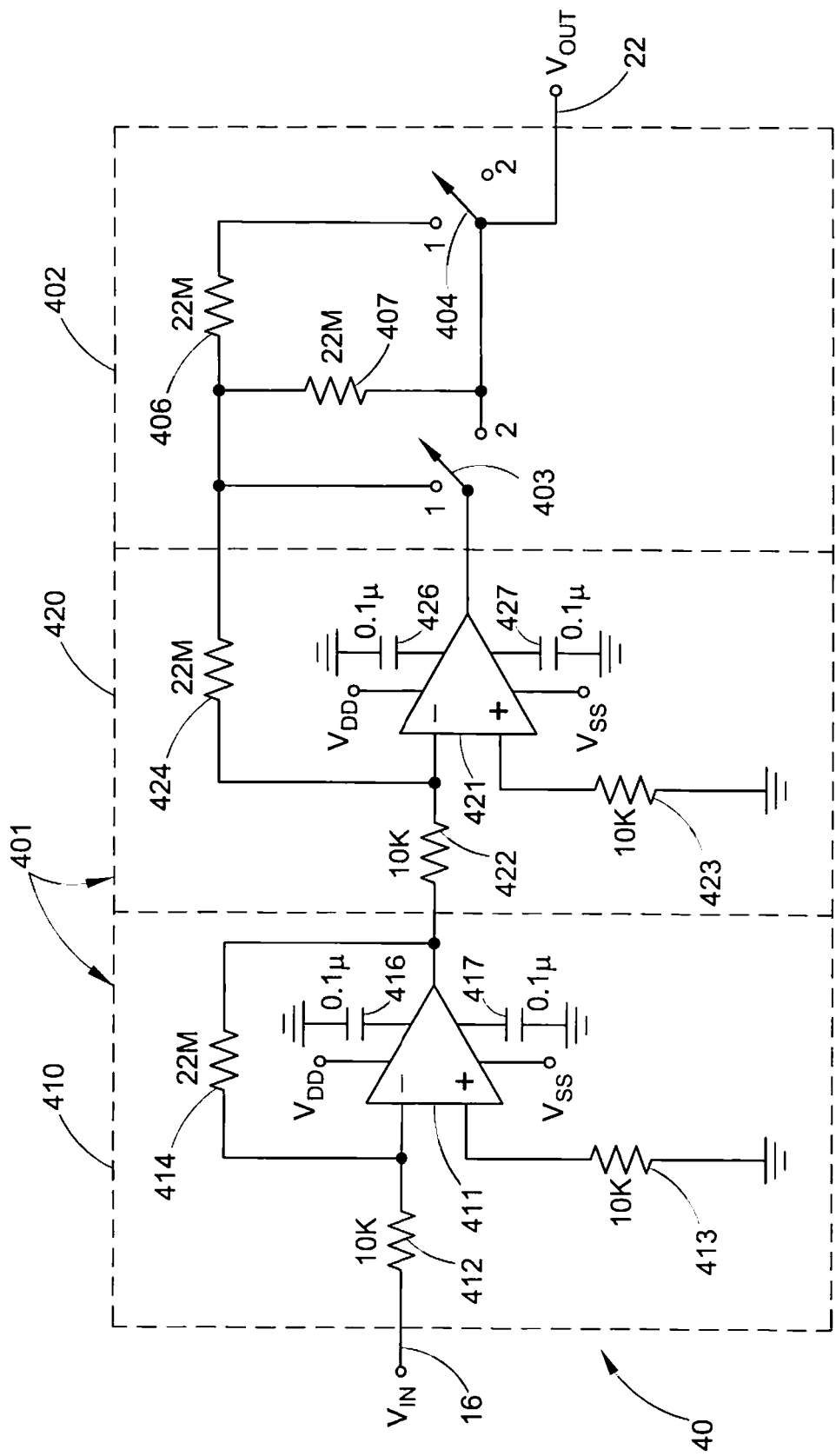
FIG. 3 is a schematic diagram of an embodiment of an amplifier.

FIG. 3 presents a schematic diagram of an exemplary amplifier 40 for use with Wireless PMU 10. Amplifier 40 includes two stages of amplification 401 and an adjustable gain selection circuit 402. A first stage of amplification 410 may be provided by an operational amplifier 411 such as the Model OP177 Ultra Precision Operational Amplifier (Op Amp) from Analog Devices, Inc. of Norwood, Mass. 10 Kiloohm (K$\Omega$) resistors 412, 413 are respectively, electrically connected between the input voltage signal 16 and the inverting input 411 of Op Amp 410, and ground and the noninverting input of Op Amp 410. Op Amp 410 also includes a 2.2 megaohm (M$\Omega$) feedback resistor 414, and two 0.1 microFarad ($\mu F$) capacitors 416, 417. Configured in this manner, first stage amplifier 410 provides a gain ratio of 200.

A second stage of amplification 420 may be provided by an Op Amp 421 such as the Model OP17 Precision Op Amp also from Analog Devices, Inc. Op Amp 421 includes like valued and electrically connected resistors 422. 423 and 424, and capacitors 426, 427 as provided with Op Amp 411. In order to accommodate the range of gains necessary for the different current magnitudes in transmission line 11. adjustable gain selection circuit 402 is provided and includes two maintained contact selector switches 403, 404 each having two-positions identified as 1 and 2, and two 2.2 MΩ resistors 406, 407. The selector conductor of switch 403 is electrically connected to the output of Op Amp 421. Switch 403 position 1 is electrically connected to one side of resistors 406. 407, and 424. Switch 403 position 2 is electrically connected to the opposite side of resistor 407, and the selector conductor of switch 404. Switch 404 position 1 is electrically connected to the opposite side of resistor 406, and switch 404 position 2 is unconnected. Configured in this manner, second stage amplifier 410 provides a gain ratio of 200 when switch 403 is in position 1 and switch 404 is in position 2, a gain ratio of 300 when switch 403 is in position 2 and switch 404 is in position 1. and a gain ratio of 400 when switches 403 and 404 are both in position 2. This provides a total gain ratio from amplifier 40 of 40,000, 60,000 and 80,000. for the respective positions of switches 403 and 404.

Under real measurement conditions, we have found amplifier 20 output signal 22 includes several deleterious anomalies, including a direct current (DC) offset, internal device and external environmental induced noises, harmonics, oscillations and nonsinusoidal components. Hardware RC filtering removes the DC offset, but fails to remove all remaining noise, harmonics and nonsinusoidal components. We have also found that the use of a third order Butterworth design, digital low pass filter having a second order cutoff frequency at 70 Hertz (Hz) as low pass filter 30, and hardware shielding described below, substantially eliminates or at least significantly reduces all remaining deleterious anomalies. Also. unlike a conventional hardware RC filter. a digital filter does not introduce additional noise.

The exemplary magnetic field transducer 15 and the exemplary digital low pass filter 30 described above together with a power supply furnishing ±15 V produces a maximum, peak-to-peak voltage in output signal 32 reaching 30 V, and improving the overall measurement accuracy of Wireless PMU 10 by bringing the magnitude of the input signal 32 to A/D converter 40 to the maximum magnitude that A/D converter 40 can process. known as the input magnitude limit.

The magnetic field transducer 15 may be partially shielded and/or conductors from magnetic field transducer 15 carrying its output signal 16 may be shielded by aluminum foil or other suitable shielding material. Components of Wireless PMU 10 may be placed in an enclosure providing magnetic shielding, for purposes of illustration but not by way of limitation, such as an iron enclosure.

A comparison of the overall current phasor measurement accuracy of Wireless PMU 10 with that of a directly connected PMU or FDR can be made using a statistical comparison of frequency measurement over random intervals of time. Because wireless PMU measurement data contains more noises and outliers, it is appropriate to perform this comparison using the statistical smoothing function of a Moving Median Filter (MMF). An analysis using an estimated 31 points MMF upon random sampled data over intervals of 300 seconds revealed that the overall current phasor measurement accuracy of Wireless PMU 10 is as high as that of a directly connected PMU or FDR.

An accurate magnetic field sensor and method for a Wireless Phasor Measurement Unit (Wireless PMU) is therefore provided. The Wireless PMU is much less costly and easier to install and maintain than PMUs that use current transformers and potential transformers to measure phasor data. While the transduction measurement of an electrical characteristic of a current carrying element by the Wireless PMU is carried out wirelessly, the transmission of the phasor data may proceed wirelessly or via a wired network.

In certain embodiments, the Wireless PMU may include a coil for magnetic field transduction measurement of phasor data in a transmission line having a widely variable current. The coil output is amplified by a two stage, high gain, selectable gain ratio amplifier that maintains a substantially constant order of magnitude in the amplifier output as the current varies. A digital low pass filter of a third order Butterworth configuration substantially reduces deleterious anomalies appearing in the amplifier output. Shielding is provided to further reduce anomalies. Phasor data is calculated by a processor, and is at least as accurate as phasor data from a PMU using transformers to measure the same electrical characteristic, and FDR devices under both steady state and dynamic conditions.

The Wireless Phasor Measurement Unit and method therefore is not limited to the specific embodiments described above, but includes variations, modifications, and equivalent embodiments defined by the following claims. The embodiment described above is not necessarily in the alternative, as various embodiments may be combined to provide the desired characteristics.

We claim:

1. A phasor measurement unit comprising:
   a magnetic field transducer for transduction measurement of an electrical characteristic of a current carrying element in at least one of electrical power generation or distribution systems, said transducer generating a transducer output signal representative of said electrical characteristic, wherein
   a) the current carrying element generates a magnetic field,
   b) the magnetic field transducer is a coil having an air core producing substantially no magnetic nonlinearities when the coil is in the magnetic field, and
   c) the transducer output signal is transduced from said magnetic field;
   an amplifier receiving said transducer output signal and generating an amplifier output signal;
   a filter receiving said amplifier output signal, low pass filtering said amplifier output signal, and generating a filter output signal;
   an analog to digital converter receiving said filter output signal and generating a digital output signal; and
   a processor receiving said digital output signal, calculating phasor data from said digital output signal and generating a data output signal, wherein said calculated phasor data is at least as accurate as phasor data from a phasor measurement unit or a frequency data recorder having a transducer for nontransduction measurement of the same electrical characteristic.

2. The phasor measurement unit of claim 1 wherein said coil has about 400 turns, a coil length of about 1.5 cm. a coil inner diameter of about 5 mm, and a coil external diameter of about 1 cm.

3. The phasor measurement unit of claim 1 wherein said analog to digital converter has an input magnitude limit, and said amplifier output signal has a maximum peak-to-peak voltage magnitude approximating said input magnitude limit.

4. The phasor measurement unit of claim 1 wherein the current carried by said current carrying element varies over at least one order of magnitude, and said amplifier has a plurality of selectable gain ratios to maintain a substantially constant order of magnitude in said amplifier output signal as said current varies.

5. The phasor measurement unit of claim 1 wherein said amplifier includes a plurality of successive stages.

6. The phasor measurement unit of claim 1 wherein said filter substantially reduces deleterious anomalies appearing in said amplifier output signal.

7. The phasor measurement unit of claim 6 wherein said filter is a digital low pass filter of a third order Butterworth configuration having a second order cutoff frequency at about 70 Hertz.

8. The phasor measurement unit of claim 1 wherein conductors carry said transducer output signal, and said transducer output signal conductors, said amplifier, said filter, said analog to digital converter, and said processor are shielded from magnetic field interference.

9. The phasor measurement unit of claim 1, further including a wireless data transmission device.

10. The phasor measurement unit of claim 1, further comprising a GPS detector adapted to provide a GPS synchronization signal to said processor.

11. A method for phasor measurement comprising:
transducing an electrical characteristic from a magnetic field generated by a current carrying element in at least one of electrical power generation or distribution systems, comprising transducing said electrical characteristic from a coil having an air core producing substantially no magnetic nonlinearities when said coil is in said magnetic field;
generating a transducer output signal representative of said electrical characteristic;
amplifying said transducer output signal;
generating an amplifier output signal;
low pass filtering said amplifier output signal;
generating a filter output signal;
converting said filter output signal to a digital output signal:
calculating phasor data from said digital output signal: and
generating a data output signal based on said calculated phasor data, wherein said calculated phasor data is at least as accurate as phasor data from a phasor measurement unit or a frequency data recorder having a transducer for nontransduction measurement of the same electrical characteristic.

12. The method for phasor measurement of claim 11 wherein said transducing said electrical characteristic from a coil having an air core includes transducing said electrical characteristic from a coil having about 400 turns, a coil length of about 1.5 cm, a coil inner diameter of about 5 mm. and a coil external diameter of about 1 cm.

13. The method for phasor measurement of claim 11 wherein an analog to digital converter having an input magnitude limit performs said converting said filter output signal, and said amplifying said transducer output signal includes amplifying said transducer output signal to a maximum peak-to-peak voltage magnitude approximating said input magnitude limit.

14. The method for phasor measurement of claim 11 wherein the current carried by said current carrying element varies over at least one order of magnitude, and said amplifying said transducer output signal includes selecting a gain ratio from a plurality of gain ratios to maintain a substantially constant order of magnitude in said amplifier output signal as said current varies.

15. The method for phasor measurement of claim 11 wherein said filtering includes substantially reducing deleterious anomalies appearing in said amplifier output signal.

16. The method for phasor measurement of claim 15 wherein said filtering includes filtering using a digital low pass filter of a third order Butterworth configuration having a second order cutoff frequency at about 70 Hertz.

17. The method for phasor measurement of claim 11 wherein a transducer generates said transducer output signal, conductors carry said transducer output signal, an amplifier generates said amplifier output signal, a filter generates said filter output signal, an analog to digital converter generates said digital output signal, and a processor generates said data output signal, said method for phasor measurement further including shielding from magnetic field interference said transducer output signal conductors, said amplifier, said filter, said analog to digital converter, and said processor.

18. The method for phasor measurement of claim 11 wherein generating the data output signal includes receiving a GPS synchronization signal from a GPS detector and generating GPS-synchronized phasor data.

* * * * *